United States Patent
North et al.

(10) Patent No.: US 10,551,888 B1
(45) Date of Patent: Feb. 4, 2020

(54) SKIN TRANSITION THERMAL CONTROL FOR CONVERTIBLE INFORMATION HANDLING SYSTEMS

(71) Applicant: Dell Products L.P., Round Rock, TX (US)

(72) Inventors: Travis C. North, Cedar Park, TX (US); Mitch Anthony Markow, Hutto, TX (US); Joohyun Woo, Austin, TX (US); Carlos Humberto Granja, Austin, TX (US); Richard Christopher Thompson, Cedar Park, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 16/102,324

(22) Filed: Aug. 13, 2018

(51) Int. Cl.
  *G06F 1/20* (2006.01)
  *G06F 1/16* (2006.01)
  *H05K 7/20* (2006.01)
  *F24F 11/74* (2018.01)

(52) U.S. Cl.
  CPC .............. *G06F 1/206* (2013.01); *F24F 11/74* (2018.01); *G06F 1/1616* (2013.01); *G06F 1/1677* (2013.01); *G06F 1/1681* (2013.01); *G06F 1/203* (2013.01); *H05K 7/20136* (2013.01); *H05K 7/20209* (2013.01); *H05K 7/20327* (2013.01); *H05K 7/20381* (2013.01); *G06F 2200/201* (2013.01)

(58) Field of Classification Search
  CPC ........ G06F 1/1637; G06F 1/1616; G06F 3/01; G06F 3/0414; G06F 1/1618; G06F 1/1654; G06F 1/1656; G06F 1/16; G06F 1/1677; G06F 1/20; H04M 1/0216; H04M 1/0245; H05K 5/0226; H05K 7/20836

USPC ............ 361/679.47, 679.01, 679.55, 679.06, 361/679.15, 679.48, 679.49, 692, 697; 345/659, 649

See application file for complete search history.

(56) References Cited

U.S. PATENT DOCUMENTS

| | | | |
|---|---|---|---|
| 5,170,634 A * | 12/1992 | Squires | ................. F17C 13/02 116/70 |
| 5,781,409 A | 7/1998 | Mecredy, III | |
| 5,818,693 A | 10/1998 | Garner et al. | |
| 5,880,929 A | 3/1999 | Bhatia | |
| 5,910,883 A | 6/1999 | Cipolla et al. | |

(Continued)

OTHER PUBLICATIONS

U.S. Appl. No. 15/952,519, filed Apr. 13, 2018, entitled "Information Handling System Thermally Conductive Hinge," to inventors Travis C. North et al.

(Continued)

*Primary Examiner* — Mandeep S Buttar
(74) *Attorney, Agent, or Firm* — Zagorin Cave LLP; Robert W. Holland (57) ABSTRACT

A convertible information handling system in a clamshell configuration provides a maximum housing surface temperature at a predetermined portion, such as a fan exhaust, that is greater than a maximum temperature in a tablet configuration. Upon detection of transition to the tablet configuration, a burst application by a thermal rejection device reduces the temperature at the predetermined portion to aid in achieving the maximum temperature of the tablet configuration. For example, a burst application may include running a fan at full speed for a defined time or decreasing a pressure within a vapor chamber.

19 Claims, 4 Drawing Sheets

(56) References Cited

U.S. PATENT DOCUMENTS

| | | |
|---|---|---|
| 6,078,499 A | 6/2000 | Mok |
| 6,141,216 A | 10/2000 | Holung et al. |
| 6,175,493 B1 | 1/2001 | Gold |
| 6,341,062 B1 | 1/2002 | Patel |
| 6,377,452 B1 | 4/2002 | Sasaki et al. |
| 6,550,531 B1 | 4/2003 | Searls et al. |
| 6,795,312 B2 | 9/2004 | Narakino |
| 7,254,019 B2 | 8/2007 | Leu |
| 7,447,029 B2 | 11/2008 | Lai et al. |
| 7,701,716 B2 | 4/2010 | Blanco, Jr. |
| 7,791,876 B2 | 9/2010 | Moore |
| 8,208,250 B2 | 6/2012 | Mongia |
| 8,675,363 B2 | 3/2014 | Croojimans |
| 9,007,759 B2 | 4/2015 | Su |
| 9,134,757 B2 | 9/2015 | Nishi |
| 9,182,794 B2 | 11/2015 | Rivera |
| 9,412,418 B2 | 8/2016 | Hu |
| 9,545,030 B2 | 1/2017 | Nikkhoo |
| 9,625,960 B1 | 4/2017 | Ent et al. |
| 9,639,126 B2 | 5/2017 | Senyk |
| 9,872,384 B2 | 1/2018 | Braley |
| 9,891,673 B2 | 2/2018 | Lee et al. |
| 9,980,412 B2 | 5/2018 | Qiu |
| 2008/0130221 A1 | 6/2008 | Varadarajan et al. |
| 2009/0025910 A1 | 1/2009 | Hoffman et al. |
| 2009/0207569 A1 | 8/2009 | Tsunoda |
| 2009/0219673 A1* | 9/2009 | Tamura .................. G06F 1/203 361/676 |
| 2011/0301778 A1* | 12/2011 | Liang ................. G05D 23/1932 700/299 |
| 2014/0063712 A1 | 3/2014 | Chung et al. |
| 2014/0160657 A1* | 6/2014 | Morrison .............. G06F 1/1626 361/679.21 |
| 2015/0346784 A1 | 12/2015 | Delano et al. |
| 2016/0118317 A1 | 4/2016 | Shedd et al. |
| 2016/0212887 A1 | 7/2016 | Nikkhoo |
| 2018/0262013 A1* | 9/2018 | Morin ................... H05K 10/00 |
| 2018/0284856 A1* | 10/2018 | Shah ...................... G06F 1/206 |

OTHER PUBLICATIONS

U.S. Appl. No. 15/952,525, filed Apr. 13, 2018, entitled "Information Handling System Housing Integrated Vapor Chamber," to inventors Travis C. North et al.

U.S. Appl. No. 15/952,528, filed Apr. 13, 2018, entitled "Information Handling System Housing Thermal Conduit Interfacing Rotationally Coupled Housing Portions," to inventors Travis C. North et al.

U.S. Appl. No. 15/952,536, filed Apr. 13, 2018, entitled "Information Handling System Dynamic Thermal Transfer Control," to inventors Travis C. North et al.

U.S. Appl. No. 15/952,538, filed Apr. 13, 2018, entitled "Graphite Thermal Conduit Spring," to inventors Travis C. North et al.

U.S. Appl. No. 15/952,543, filed Apr. 13, 2018, entitled "Graphite Thermal Conduit Spring," to inventorsTravis C. North et al.

U.S. Appl. No. 15/952,551, filed Apr. 13, 2018, entitled "Information Handling System Thermal Fluid Hinge," to inventors Travis C. North et al.

* cited by examiner

SKIN TRANSITION THERMAL CONTROL FOR CONVERTIBLE INFORMATION HANDLING SYSTEMS

BACKGROUND OF THE INVENTION

Field of the Invention

The present invention relates in general to the field of information handling system thermal management, and more particularly to skin transition thermal control for convertible information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems with convertible configurations typically include separate housing portions rotationally-coupled to each other with one or more hinges. As an example, a typical convertible information handling system has a main housing portion that contains processing components disposed under a keyboard and a lid housing portion that contains a display to present visual images. The processing components execute instructions to generate visual information that is passed to the display for presentation as visual images. A hinge rotationally couples the main and lid housing portions to each other between closed, clamshell, tent and tablet configurations selectable by an end user. In a closed configuration, the display closes over the main housing portion keyboard to protect the display. From the closed configuration, the lid portion rotates approximately 90 degrees open to the clamshell configuration having the display held perpendicular over the keyboard in a viewing position. From the clamshell configuration, approximately 180 degrees of additional rotation provides a tent configuration with main housing portion acting as a stand that holds the display in a viewing position. A full 360 degrees of rotation of the housing portions from the closed configuration puts the housing portions in a tablet configuration having the display exposed to accept touch inputs and the keyboard rotated to act as a support. In the tablet configuration, an end user interacts with a touchscreen by holding the information handling system or resting the information handling system on its keyboard over a support surface, such as a desktop. In alternative embodiments, alternative housing movements may be used to achieve the closed, clamshell, tent and tablet configurations.

One problem associated with portable information handling systems is that thermal energy created by dissipation of power by processing components tends to increase the housing skin temperature to a point that becomes uncomfortable for an end user touch. Portable information handling systems often include active thermal dissipation systems to help transfer thermal energy from the housing and thus reduce skin temperatures, such as a cooling fan that generates a cooling airflow over processing components. Generally, a housing skin area that will come in contact with an end user should have a temperature of 52 degrees Celsius or less. Other parts of the portable information handling system may have slightly greater skin temperatures in areas where an end user does not touch as often. As an example, in a clamshell mode where an end user is typing at a keyboard, temperatures at the keycaps, palm rest and touchpad should remain relatively cool as these are areas that an end user commonly interacts with; however, rare touch areas such as the hinge, rear strip and cooling fan exhaust may have temperatures of as high as 70 degrees Celsius. Indeed, elevated temperatures across rare touch areas provide improved thermal rejection to an external environment with greater areas of heated surface exposed to the external environment so that more commonly touched areas remain cool as excess thermal energy is efficiently rejected out of the system.

One difficulty with using elevated temperatures at rare touch areas when an information handling system is in a clamshell configuration is that an end user who desires to convert the information handling system to a tent or tablet configuration will tend to have more extended touch interaction with the rare touch areas during and after the conversion to the tent or tablet configuration. For example, hinge and fan exhaust areas of the housing that have elevated skin temperatures to enhance thermal energy rejection in a clamshell configuration will have excessive skin temperatures as these rare touch areas convert to common touch areas of a tent or tablet configuration. For instance, an end user will commonly grasp the rear part of the housing when manipulating the housing portions to rotate the lid housing portion relative to the main housing portion. Further, an end user is more likely to grasp along the sides of the converted housing in the tablet configuration while making touch inputs at the display touchscreen. Thus, during configuration conversions, rare touch areas where elevated temperatures are desired to help with thermal rejection quickly become common touch areas where elevated temperatures interfere with end user interactions. If a rare touch area has an elevated skin temperature upon transition of the information handling system configuration so that the skin temperature should drop to that of a common touch area, stored thermal energy within the information handling system will delay skin temperature transition to the lower desired skin temperature level. A similar dynamic temperature constraint change may take place in a conversion from tablet to clamshell configurations. For instance, increased skin temperatures at a keyboard decreases end user comfort when typing inputs while decreased skin temperatures at the fan exhaust reduce thermal rejection efficiency. Lag in thermal transitions at conversion are rare and common touch areas interfere with end user transitions between convertible information handling system configurations.

SUMMARY OF THE INVENTION

Therefore, a need has arisen for a system and method which provide dynamic control at conversion of an information handling system configuration to more quickly adapt skin temperatures to fall within changing thermal constraints.

In accordance with the present invention, a system and method are provided which substantially reduce the disadvantages and problems associated with previous methods and systems for managing skin temperatures of a convertible information handling system during conversion between housing configurations. Upon detection of transition of a housing configuration that alters a housing portion between a common touch and rare touch area, a burst thermal management response adapts the surface temperature to a constraint associated with the associated common touch or rare touch area usage model.

More specifically, a convertible information handling system has two or more housing portions that move relative to each other to convert between clamshell and tablet configurations, such as by rotating 360 degrees about a hinge. In the clamshell configuration, a fan exhaust at a rear surface of a main housing portion rejects thermal energy with a surface temperature elevated to a first maximum temperature associated with rare touch surface areas, such as 70 degrees Celsius. In the clamshell configuration, a lid housing portion elevates substantially perpendicular to the main housing portion in viewing position so that end user touches to the fan exhaust area are less likely. Rotation of the lid housing portion relative to the main housing portion to a tablet configuration converts the fan exhaust from a rare touch area located out of an end user's normal grasp to a common touch area that an end user is more likely to grasp during use of the system as a tablet. A thermal manager monitors the convertible information handling system configuration transitions and provide burst thermal rejection at a rare touch area upon conversion to a common touch area, such as cooling fan exhaust after conversion from clamshell to tablet mode. For example, the thermal manager applies full cooling fan speed for a defined time, such as ten seconds, or a predetermined time based upon thermal conditions, such as the temperature at the fan exhaust, so that the information handling system surface rapidly adapts to the temperature constraint of the housing configuration. In one embodiment, conversion of a surface from common touch to rare touch allows the thermal manager to adapt thermal rejection by allowing rapid increase of temperatures at the now-rare-touch surface, such as by increasing processor speed or adapting a vapor chamber to direct thermal energy to a less-thermally-sensitive region of the new configuration, such as a battery versus a fan exhaust in the tablet versus clamshell configurations.

The present invention provides a number of important technical advantages. One example of an important technical advantage is that a convertible information handling system provides end user comfort with rapid surface temperature adjustments at detection of a transition between clamshell and tablet configurations. In clamshell mode, providing an increased temperature in a rare touch area of the housing, such as at a fan exhaust, improves thermal rejection to allow greater power dissipation within the housing. Upon detection of a tablet configuration, a burst application of a thermal rejection device reduces surface temperatures in a rapid manner for the rare touch housing surface portions that, due to the transition to tablet configuration, become common touch areas in tablet mode. Accelerated cooling at the housing surface reduces impact on the end user related to elevated temperatures that otherwise improve thermal rejection. The end user is provided with a flexible system thermally adopted to selected user modes for optimal performance in clamshell mode and user grasp comfort in the tablet mode.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A convertible information handling system adapts surface temperatures to housing configurations with thermal rejection bursts. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
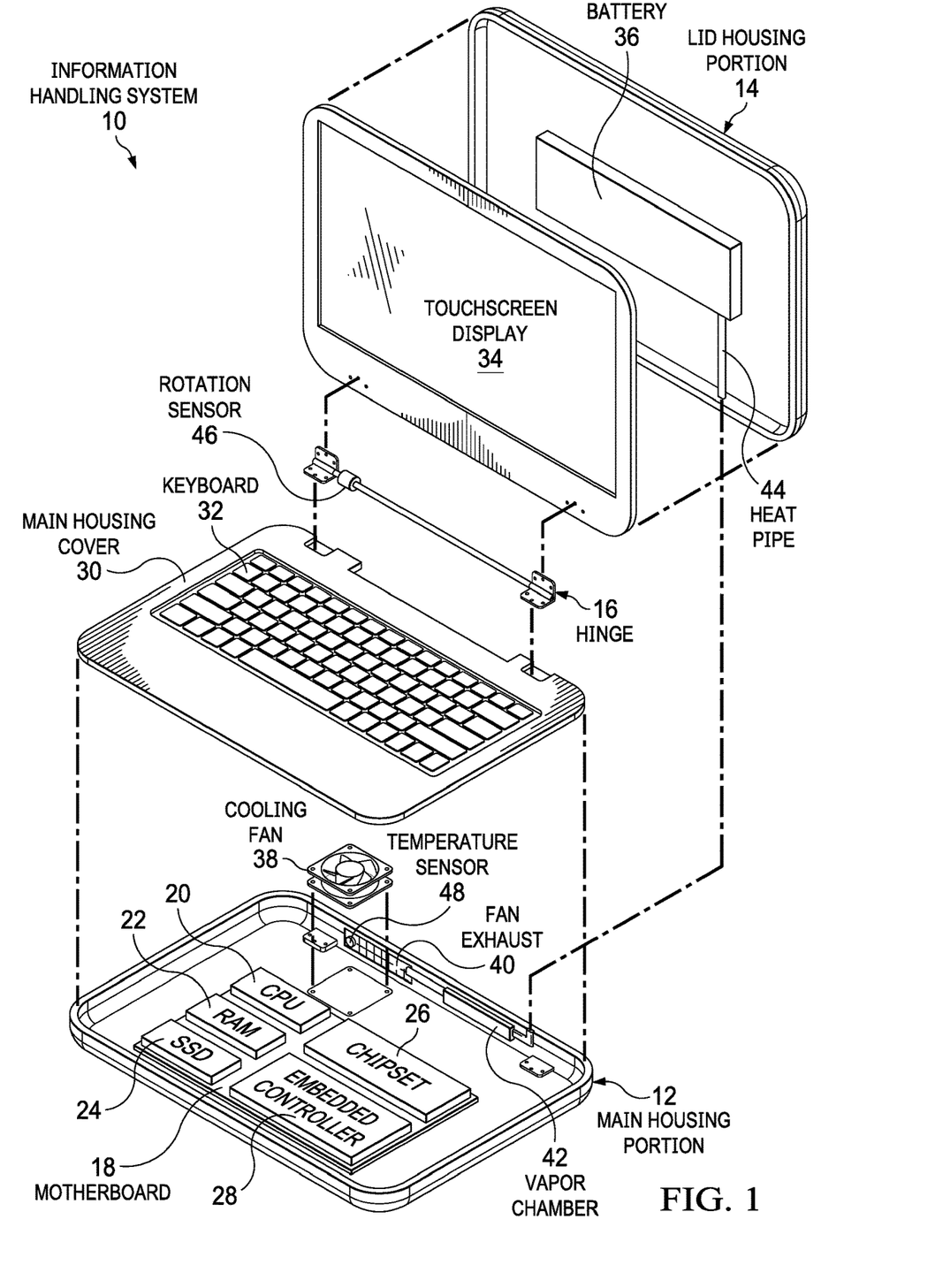
FIG. 1 depicts an exploded view of an information handling system having thermal adaptation of housing surface temperatures based upon housing configuration and related constraints.

Referring now to FIG. 1, an exploded view depicts an information handling system 10 having thermal adaptation of housing surface temperatures based upon housing configuration and related constraints. In the example embodiment, convertible information handling system 10 has a main housing portion 12 rotationally-coupled to a lid housing portion 14 with a hinge 16, such as a hinge having 360 degrees of rotation. A motherboard 18 disposed in main housing portion 12 supports communication between processing components that cooperate to process information. For instance, a central processing unit (CPU) 20 executes instructions stored in a random access memory (RAM) 22 to generate information. Instructions include an operating system and applications stored in a solid state drive (SSD) 24 or other persistent storage. A chipset 26 includes a variety of processing elements that execute embedded code stored in flash memory to coordinate communication between the processing components, such as through serial link, memory controller or other internal communication buses. An embedded controller 28, such as keyboard controller, executes embedded code stored in flash memory to manage input and output (I/O) devices and power at the processing components. In various embodiments, various arrangements of hardware, firmware and software components may perform the functions as described herein and as is known to those of skill in the art of information handling systems.

In the example embodiment, a main housing cover 30 fits over main housing portion 12 and supports a keyboard 32 that accepts typed inputs from an end user. Chipset 26 includes a graphics processor unit (GPU) that processes information into a format for presentation at a touchscreen display 34, such as by generating pixel values that define a visual image presented at display 34. A battery 36 is included in lid housing portion 14 to provide power to the processing components when external power is not available. In the example embodiments, two different thermal rejection devices are depicted that reject thermal energy from main housing portion 12, such as thermal energy generated as a byproduct of power dissipation through the processing components when processing information. One example of a thermal rejection device is a cooling fan 38 that rotates at variable speeds to generate a cooling airflow across the processing components. Cooling fan 38 exhausts heated air through a fan exhaust 40. Another example of a thermal rejected device is a vapor chamber 42, which transfers thermal energy by changing fluid states between liquid and gas with a reduced internal pressure for a desired saturation point and related fluid transition temperature. As set forth below in greater detail, a pressure adapter interfaced with vapor chamber 42 helps to control an amount and direction of thermal transfer associated with vapor chamber 42. For example, vapor chamber 42 includes the various embodiments disclose in U.S. patent application Ser. No. 15/952,519, entitled "Information Handling System Thermally Conductive Hinge", filed on Apr. 13, 2018, and incorporated herein as if fully set forth. As an example, vapor chamber 42 interfaces through a heat pipe 44 with battery 36 so that battery 36 may act as a heat sink to draw thermal energy from main housing portion 12 into lid housing portion 14.

In the example embodiment, a rotation sensor 46 detects a relative rotational relationship between main housing portion 12 and lid housing portion 14 to determine the configuration of the information handling system. For instance, rotation of zero to 135 degrees from a closed towards an open configuration indicates a clamshell configuration. Upon motion past 90 degrees towards greater than 135 degrees, a tablet configuration may be determined, such as based upon the movement through the clamshell configuration. In various embodiments, various rotational orientations and movements plus other inputs, such as accelerations, may define a transition between clamshell and tablet configurations that will result in surface temperature thermal rejection responses as described below. For instance, at greater than 135 degrees of rotation, transition to a tablet configuration may be defined and a temperature from temperature sensor 48 read to determine if fan exhaust 40 exceeds the temperature limit set for it in the tablet configuration. In one example embodiment, fan exhaust 40 has a limit of 70 degrees Celsius in the clamshell configuration and a limit of 52 degrees Celsius in the tablet configuration. The higher temperature in clamshell configuration allows increased thermal rejection to the external environment while having little user interaction at the surface area. The lower temperature in tablet configuration reduces thermal impact on an end user, who may handle information handling system 10 at the housing location of fan exhaust 40. For instance, logic in embedded controller 28, as described in greater depth below, applies the transition to a housing tablet configuration, the sensed temperature and the surface temperature constraints to burst thermal rejection, such as by running cooling fan 38 at high speed for a predefined or predetermined time, or by converting vapor chamber 42 to remove thermal energy rapidly from fan exhaust 40. As another example, during conversion from the tablet to the clamshell configuration, increased thermal energy may be directed towards fan exhaust 40, such as by increasing processor clock speeds, decreasing fan speeds, or configuring vapor chamber 42 to direct thermal energy towards fan exhaust 40.

Figure 2:
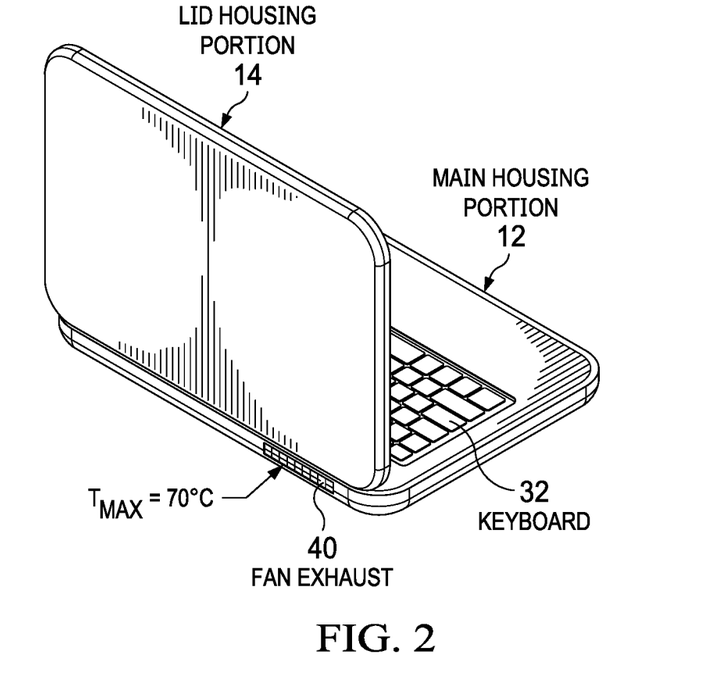
FIG. 2 depicts a rear perspective view of a convertible information handling system in a clamshell configuration having a cooling fan exhaust located at a rare touch surface location.

Referring now to FIG. 2, a rear perspective view depicts a convertible information handling system 10 in a clamshell configuration having a cooling fan exhaust 40 located at a rare touch surface location. Fan exhaust 40 is in a rare touch location at the rear of main housing portion 12 relative to an end user's normal viewing position of a display elevated by lid housing 14. Since fan exhaust 40 is less likely to have end user contact, an elevated temperature of 70 degrees Celsius is allowed.

Figure 3:
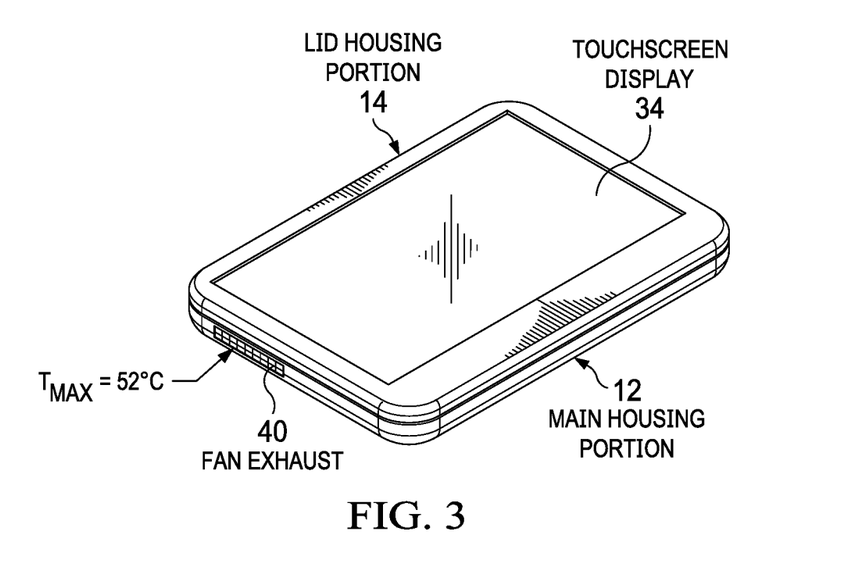
FIG. 3 depicts a rear perspective view of a convertible information handling system in a tablet configuration having the cooling fan exhaust located at a common touch surface location.

Referring now to FIG. 3, a rear perspective view depicts a convertible information handling system 10 in a tablet configuration having the cooling fan exhaust 40 located at a common touch surface location. From the clamshell configuration depicted in FIG. 3, lid housing portion 14 is rotated approximately 270 degrees to expose display 34 for end user inputs while keyboard 32 is underneath main housing portion 12. An end user grasping housing 12 to interact with display 34 is more likely to interact with the surface at fan exhaust 40 so that a lower maximum temperature is set of 52 degrees Celsius. In order to avoid end user discomfort, upon detection of a transition of fan exhaust 40 from a rare touch to a common touch surface, a burst at full speed of cooling fan 38 rapidly reduces the surface temperature, as set forth in greater detail below.

Figure 4:
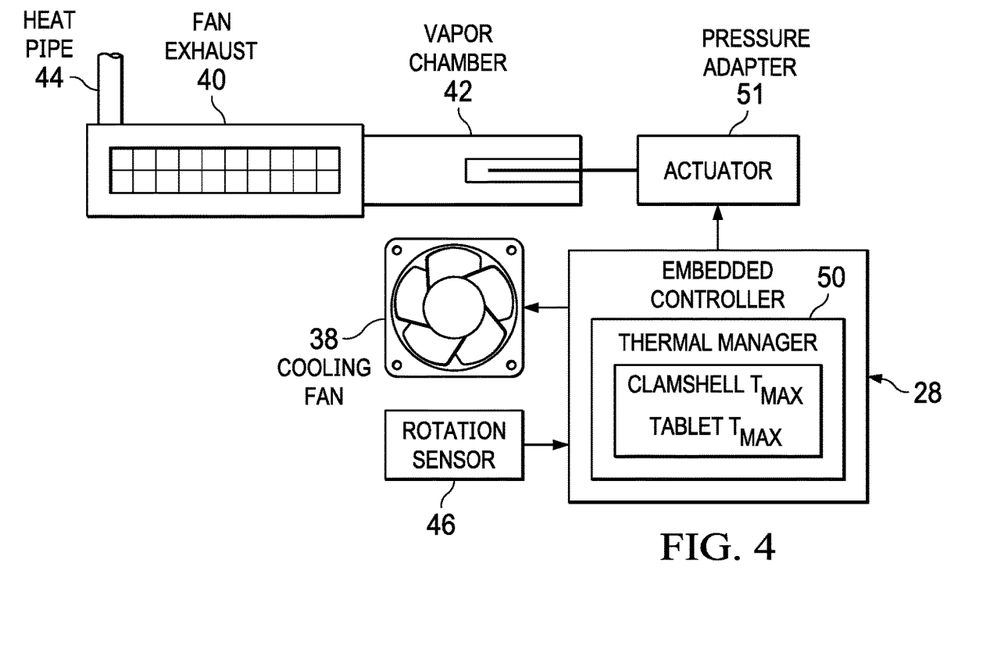
FIG. 4 depicts a block diagram of a system to manage thermal rejection for maintaining housing surfaces at different temperature constraints based upon housing configuration.

Referring now to FIG. 4, a block diagram depicts a system to manage thermal rejection for maintaining housing surfaces at different temperature constraints based upon housing configuration. In the example embodiment, a thermal manager 50 executes as embedded code stored in flash memory of embedded controller 28 that monitors housing configurations and controls thermal rejection devices to manage burst thermal events for housing surfaces. Thermal manager 50 stores a table of maximum surface area temperatures for plural housing configurations, such as clamshell and tablet maximum temperatures. In the example embodiment, a maximum temperature is stored for fan exhaust 40 in a clamshell configuration of 70 degrees Celsius and in a tablet configuration of 52 degrees Celsius. In alternative embodiments, other areas of the housing surface may have different maximum temperatures for different configurations. For example, metal, plastic and glass surface areas provide different impacts to end users at different surface temperatures based upon thermal transfer characteristics so that, for instance, plastic surface areas may have slightly higher temperatures than glass surface areas. As another example, varying surface area maximum temperatures may apply depending upon typical end user interactions. For instance, a keyboard that rotates to the bottom of the housing in tablet mode may have a slightly higher maximum temperature than a cooling fan exhaust. Thermal manager 50 stores the maximum temperatures for each desired housing configuration and manages thermal rejection devices to achieve burst cooling based upon the maximum temperature settings as configuration changes are detected.

In the example embodiment, thermal manager 50 receives rotational orientation information from rotation sensor 46 and determines a configuration change based upon one or more of the relative rotational positions of the housing portions and the rate of change of detected rotational orientation. If a change from clamshell to tablet configuration is detected, thermal manager 50 commands a burst thermal rejection to rapidly decrease the temperature at fan exhaust 40. In the example embodiment having cooling fan 38 as the thermal rejection device, thermal manager 50 commands full fan speed to increase thermal transfer from the surface of fan exhaust 40 to the external environment. In various embodiments, various burst thermal rejection responses may take place. For example, a predefined time for running the cooling fan at full speed may be applied at each configuration change event, such as 10 seconds. Alternatively, thermal rejection boost may be suppressed if temperatures at the fan exhaust already fall below the tablet maximum temperature. In another example embodiment, a predetermined time for running the cooling fan at full speed may be applied by determining the time from sensed conditions, such as a varying time based upon a sensed fan exhaust temperature. In one embodiment, full speed of the cooling fan may be commanded until sensed temperatures at the cooling fan exhaust fall below the maximum value for the configuration, however, in most embodiments, burst thermal rejection does not continue until a thermal condition is met but rather seeks to accelerate cooling initially upon change of configuration. For example, in one test a ten second burst of cooling fan operations at full speed doubled airflow from 2 CFM to 4 CFM and reduced skin temperatures by 6 degrees Celsius. Simultaneously, thermal manager 50 resets the processing component constraints to maintain the surface temperature maximums, such as throttling the CPU, GPU and memory operating frequencies. Although the example embodiment addresses fan speed burst at transition to a tablet configuration, transition to a clamshell configuration provides an opportunity to burst thermal energy into fan exhaust 40, such as by removing throttling of processing components and shutting off the cooling fan. For instance, a burst of processing by the CPU may be supported at transition from tablet to clamshell configuration to catch up on processing tasks, such as for a predefined or predetermined time.

Thermal manager 50 may also manage the temperature of fan exhaust 40 with a vapor chamber 42 thermal rejection device controlled by a pressure adapter 51, such as a solenoid that changes pressure within vapor chamber 42. In a clamshell configuration, a vapor chamber 42 directs thermal energy to fan exhaust 40 so that cooling air generated by fan 38 rejects thermal energy to the external environment. For instance, the saturation point within vapor chamber 42 may be set at 70 degrees Celsius to maintain the fan exhaust temperature at the maximum level that best rejects thermal energy. Upon transition to tablet configuration, the saturation point may be lowered by reducing pressure within vapor chamber 42, such as to 52 degrees Celsius. At the lower pressure, transition of the fluid within vapor chamber 42 from liquid to gas phase transfers thermal energy through heat pipe 44 to a distal location, such as a battery that acts as a heat sink. Upon transition from tablet to clamshell configuration, thermal manager 50 commands pressure adapter 51 to increase the pressure and saturation point so that fan exhaust 40 increases its temperature.

Figure 5:
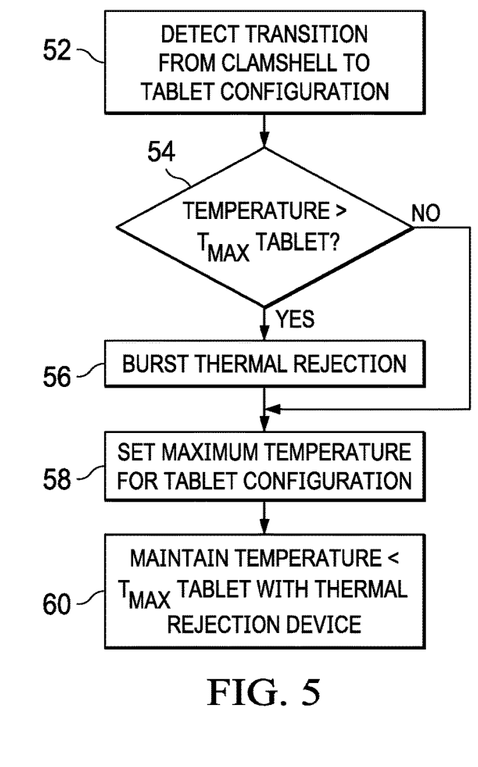
FIG. 5 depicts a flow diagram of a process for adapting a housing surface temperature with a thermal rejection burst in response to transition from a clamshell to a tablet configuration.

Referring now to FIG. 5, a flow diagram depicts a process for adapting a housing surface temperature with a thermal rejection burst in response to transition from a clamshell to a tablet configuration. The process starts at step 52 with detection of transition from clamshell to tablet configuration. At step 54, a determination is made of whether the fan exhaust temperature exceeds the maximum temperature of the tablet configuration. If so, the process continues to step 56 to burst thermal rejection, such as by running the cooling fan at full speed for a predefined or predetermined time. At step 58, the maximum temperature is set to match the tablet configuration, such as by adjusting the internal thermal management of CPU throttling to tablet configuration temperatures. At step 60, the temperature at the housing surface is maintained within the maximum tablet temperature using the thermal rejection device and internal processing component thermal management.

Figure 6:
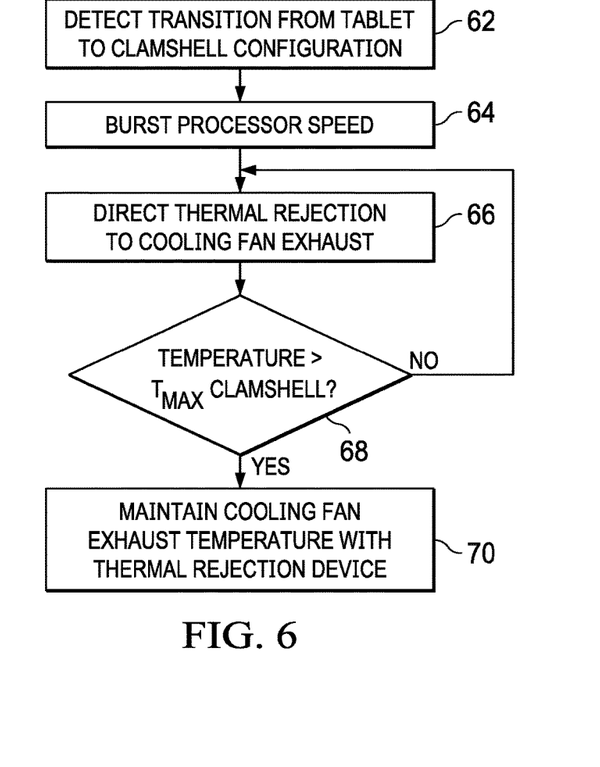
FIG. 6 depicts a flow diagram of a process for adapting a housing surface temperature with thermal rejection to transition from a tablet configuration to a clamshell configuration.

Referring now to FIG. 6, a flow diagram depicts a process for adapting a housing surface temperature with thermal rejection to transition from a tablet configuration to a clamshell configuration. The process starts at step 62 with transition from the tablet to the clamshell housing configuration. At step 64, CPU speed is burst for a predefined or predetermined time period since the increased thermal capacity provided by increased surface temperature supports storage of excess thermal energy. At step 66, thermal rejection is directed towards the cooling fan exhaust or other surface areas that have configured with an increased maximum temperature, such as by adapting a vapor chamber saturation point. In the example embodiment, the process continues to step 68 at which a determination is made of whether the temperature at the housing surface has increased to the maximum amount. If not, the process returns to step 66 to allow continued thermal energy increased performance. In an alternative embodiment, the increased processor speed burst may be maintained for a reduced time period independent of surface area temperatures. At step 70, the cooling fan exhaust temperature is maintained within the clamshell temperature maximum with the thermal rejection devices and internal processing component thermal management.

Although the present invention has been described in detail, it should be understood that various changes, substitutions and alterations can be made hereto without departing from the spirit and scope of the invention as defined by the appended claims.

What is claimed is:
1. An information handling system comprising:
   a housing having first and second housing portions rotationally coupled to each other to transition between closed, clamshell and tablet configurations;
   processing components disposed in the first housing portion to process information;

a display disposed in the second housing portion and interfaced with the processing components to present the information as visual images;

a thermal rejection device disposed in the housing to transfer thermal energy out of the second housing portion;

a configuration sensor operable to detect movement of the first and second housing portions between the closed, clamshell and tablet configurations; and a thermal manager interfaced with the thermal rejection device and configuration sensor, the thermal manager selectively applying the thermal rejection device to adjust a skin temperature at a predetermined housing portion position in response to detection of movement between clamshell and tablet configurations, the clamshell configuration having a clamshell maximum skin temperature, the tablet configuration having a tablet maximum skin temperature of less than the clamshell maximum skin temperature, the thermal manager applying the thermal rejection device in a burst at detection of movement from the clamshell configuration to the tablet configuration when the skin temperature exceeds the tablet maximum skin temperature.

2. The information handling system of claim 1 wherein:
the thermal rejection device comprises a cooling fan that generates a cooling airflow within the first housing portion;
the predetermined housing portion position comprises a cooling fan exhaust disposed in the first housing portion and aligned to exhaust the cooling airflow; and
the movement comprises a rotation of the first housing portion relative to the second housing portion past an angular relationship associated with the clamshell configuration towards an angular relationship associated with the tablet configuration.

3. The information handling system of claim 2 wherein the thermal manager selectively applies the thermal rejection device by bursting cooling airflow from the cooling fan through the cooling fan exhaust for a predetermined time.

4. The information handling system of claim 3 wherein the predetermined time comprises a time determined from thermal rejection that lowers the cooling fan exhaust temperature from the clamshell maximum skin temperature to the tablet maximum skin temperature.

5. The information handling system of claim 4 further comprising a temperature sensor interfaced with the cooling fan exhaust and the thermal manager, the thermal manager withholding the bursting cooling airflow if the cooling fan exhaust temperature sensed by the temperature sensor is at or below the tablet maximum skin temperature.

6. The information handling system of claim 1 wherein:
the movement comprises a rotation of the first housing portion relative to second housing portion past an angular relationship associated with the tablet configuration towards an angular relationship associated with a clamshell configuration; and
the thermal manager selectively applies the thermal rejection device to an off condition to increase the skin temperature at the predetermined housing portion position.

7. The information handling system of claim 1 wherein the configuration sensor comprises a rotation sensor interfaced with a hinge that rotationally couples the first and second housing portions to each other.

8. The information handling system of claim 1 further comprising:
a vapor chamber having a fluid that transitions between liquid and gas states to transfer thermal energy; and
a pressure adapter that adjusts pressure within the vapor chamber to adjust a fluid transition temperature of the vapor chamber.

9. The information handling system of claim 8 wherein the thermal manager selectively applies a pressure with the pressure adapter upon detection of movement from the clamshell to the tablet configuration, the pressure reduced at the predetermined housing portion position to transition fluid from a liquid state to a gaseous state.

10. A method for managing information handling system housing surface temperatures, the method comprising:
detecting a transition of the information handling system housing from a first rotational orientation configuration having a first surface temperature limit to a second rotational orientation configuration having a second surface temperature limit;
in response to the detecting, bursting thermal transfer of a thermal rejection device for a predetermined time to adjust the housing surface temperature;
managing the thermal rejection device after the bursting to maintain the housing surface temperature below the second surface temperature limit;
detecting a transition of the information handling system housing from the second rotational orientation to the first rotational orientation; and
in response to the detecting, bursting processing speed of a processor disposed in the housing at least until the housing surface temperature increases to the first surface temperature limit.

11. The method of claim 10 wherein:
the information handling system housing comprises lid and main housing portions rotationally coupled to each other;
the first rotational orientation configuration comprises a clamshell configuration;
the second rotational orientation configuration comprises a tablet configuration; and
the housing surface temperature comprises a predetermined portion of the housing associated with an end user grasp in the tablet configuration.

12. The method of claim 11 wherein the bursting thermal transfer further comprises:
adjusting a cooling fan to full speed for ten seconds; and
after the ten seconds, running the cooling fan at a speed associated with thermal conditions.

13. The method of claim 11 wherein the bursting thermal transfer further comprises:
detecting a temperature at the predetermined portion;
disabling the bursting if the detected temperature is less than the second surface temperature limit; and
setting the predetermined time based upon an amount that the detected temperature exceeds the second surface temperature limit.

14. The method of claim 13 wherein predetermined portions of the housing comprises a cooling fan exhaust.

15. The method of claim 11 wherein the bursting thermal transfer further comprises reducing pressure within a vapor chamber to convert liquid proximate to the predetermined portion of the housing to gas, the gas transferring thermal energy from the predetermined portion to a different portion of the housing.

16. A system for managing information handling system surface temperatures, the system comprising:
an embedded controller operable to execute instructions; and non-transitory memory interfaced with the embedded controller, the non-transitory memory storing instructions that, when executed on the embedded controller:

detect transition of an information handling system from a clamshell configuration to a tablet configuration;

detect a temperature at a predetermined portion of the information handling system housing that exceeds a tablet configuration maximum temperature; and in response to the detect of a temperature at a predetermined portion of the information handling system housing that exceeds a tablet configuration maximum temperature, burst a thermal rejection device to reduce the temperature at the predetermined portion.

17. The system of claim 16 wherein the thermal rejection device comprises a vapor chamber having a pressure adapter, the burst comprising a decrease of pressure in the vapor chamber.

18. The system of claim 16 wherein:
the thermal rejection device comprises a cooling fan exhausting air from a fan exhaust; and
the predetermined portion comprises the fan exhaust.

19. The system of claim 18 wherein the burst comprises running the cooling fan at full speed for a defined time period.

* * * * *